United States Patent [19]

Seiler et al.

[11] Patent Number: 4,929,889

[45] Date of Patent: May 29, 1990

[54] DATA PATH CHIP TEST ARCHITECTURE

[75] Inventors: Larry D. Seiler, Boylston; James L. Pappas, Leominster; Robert C. Rose, Hudson, all of Mass.

[73] Assignee: Digital Equipment Corporation

[21] Appl. No.: 206,194

[22] Filed: Jun. 13, 1988

[51] Int. Cl.$^5$ ............................................ G01R 31/26
[52] U.S. Cl. .................................. 371/22.3; 371/25.1
[58] Field of Search ............ 324/73 R, 73 PC, 73 AT; 371/20, 25, 26

[56] References Cited

U.S. PATENT DOCUMENTS

| | | | |
|---|---|---|---|
| 4,493,078 | 1/1985 | Daniels | 324/73 R |
| 4,577,318 | 3/1986 | Whitacre et al. | 324/73 R |
| 4,631,724 | 12/1986 | Shimizu | 371/25 |
| 4,635,261 | 1/1987 | Anderson et al. | 371/25 |
| 4,749,947 | 6/1988 | Gheewala | 324/73 R |

OTHER PUBLICATIONS

Built-In Test for VLSI: Pseudorandom Techniques, by Paul H. Bardell, William H. McAnney and Jacob Savir; International Business Machines Corporation; John Wiley & Sons, New York, 1987.

Primary Examiner—Reinhard J. Eisenzopf
Assistant Examiner—Edward Urban

[57] ABSTRACT

A system and method for testing nodes, or test points, of an integrated circuit are presented. The invention includes a test/load bus which is used to sequentially load test data and other data onto the integrated circuit chip, to sample test points and to read data previously loaded onto the chip. The test/load bus and its control logic are used for both testing the chip and for loading and dumping data from the chip so that the test capability adds little to the area of the chip.

12 Claims, 4 Drawing Sheets

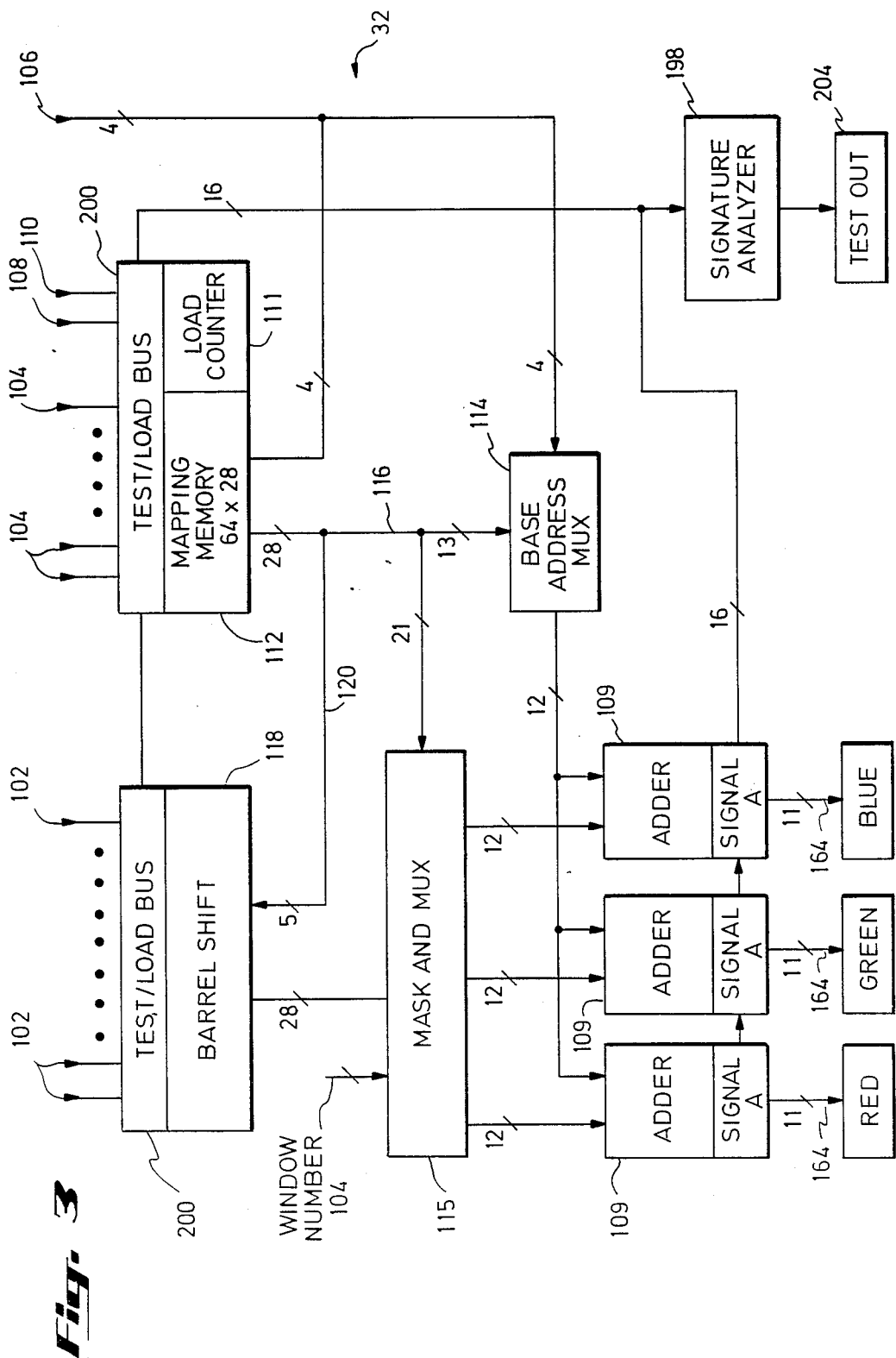

ns, all of which are assigned to the assignee of the
DATA PATH CHIP TEST ARCHITECTURE

RELATED APPLICATIONS

This invention is related to the following applications, all of which are assigned to the assignee of the present invention and concurrently filed herewith in the names of the inventors of the present invention:

Semaphore Controlled Video Chip Loading in a Computer Video Graphics System, Ser. No. 206,203.

Pixel Lookup in Multiple Variably-Sized Hardware Virtual Colormaps in a Computer Video Graphics System, Ser. No. 206,026.

Window Dependent Pixel Datatypes in a Computer Video Graphics System 206,031.

Apparatus and Method For Specifying Windows With Priority Ordered Rectangles in a Computer Video Graphics System, Ser. No. 206,030.

BACKGROUND OF THE INVENTION

This invention relates generally to the field of semiconductor integrated circuits. More particularly, this invention relates to a circuit and method of testing and debugging internal integrated circuit chip functions as well as testing and debugging of integrated circuit chips in their board environment.

Integrated circuit chips have increased in complexity since their inception years ago. The first chips implemented a few logic gates. Today, one integrated circuit device may consist of one hundred thousand or more gates. This level of integration is VLSI, or Very Large Scale Integration. Entire processors can be implemented on a single chip, where before hundreds of separate chips were required.

As the number of gates in an integrated circuit chip increases, the difficulty of testing the chip increases correspondingly. The method of using hand-selected input combinations can no longer easily control and observe all internal gates. Logic in known integrated circuits now consists of state machines implemented by memory elements. With the increasing complexity of integrated circuits, the parameters of test development time, maintenance time, execution time, and storage space requirements escalate, while obtainable fault coverage decreases. Recently, the cost of this method has become unacceptable.

Known graphics systems use a memory, such as a frame buffer, for storing pixel values to be displayed on a monitor. Digital logic between the frame buffer and the monitor, also called video back-end logic, interprets and manipulates the pixel values for display. Testing the digital logic between the frame buffer and the monitor in a graphics system is a difficult problem for two reasons. First, the high data rates require fast test logic and data compression. Second, the video back-end logic may contain large amounts of embedded memory, such as colormaps, which require significant time to test exhaustively.

Because of these problems, known video systems have incorporated very limited, if any, testing capability. For example, the setup screens in some known systems were designed to contain examples of all supported display modes. This allowed limited testing to be done by visual inspection of the setup screen.

Other known systems have included a degree of support for automatic testing in their video logic. However, this test support is frequently limited to production testing. Once the unit is in the field, it can no longer be automatically tested. In other cases, the test support provided is sufficiently limited that a comprehensive test of the video subsystem would take hours. In these cases, automatic self test is possible, but not very practical.

Another known system contains a register that latches the digital data prior to the digital to analog converter (DAC) that drives the monitor. The latch can capture any single pixel in the frame of pixel data by positioning the cursor to that location. Every 1/60th of a second, during vertical retrace, the processor can examine the latched pixel value. In order to test each pixel, nearly 900,000 frames must by tested, which would take 4 hours or more. Since this is impractical, only limited testing is actually performed.

While some forms of on chip testing are known, as integrated circuits increase in complexity, a dedicated test bus and logic gets increasingly expensive. The dedicated test architecture exacts a toll in chip area and reduced yield due to failures in the test architecture itself. For these reasons, a dedicated test architecture in complex integrated circuits is not attractive.

It is known to use so-called Linear Feedback Shift Registers (LFSR) in computer systems. A LFSR is a shift register with the output fed back into some of the input stages. It consists of three basic components: memory elements in the form of delay flip-flops, modulo-two summers in the form of exclusive-OR gates, and binary constant multipliers.

The LFSR performs a division operation, a property that has applications in pseudo-random number generation and signature analysis. The transition from the current state of the register to the next state is equivalent to division of the input by the register's characteristic polynomial. The register's characteristic polynomial is determined by which of the input stages has the output of the LFSR fed into them. The remainder after each division step is the state of the register.

When a LFSR is initialized with a non-zero value, and the inputs are tied to a constant, the state of the register cycles through a sequence of pseudo-random numbers. Although the numbers produced are predictable, they satisfy certain random-number properties that make the numbers useful as test input vectors. For an LFSR of thirty-two stages, over four billion unique states result.

When the register inputs are tied to a bus, the state of the register can be used as a signature. This signature is unique for a specific input string with a very high probability. This signature can be compared to an expected signature to test the validity of the tested signature. It would be desirable to incorporate a LFSR into an integrated circuit to provide chip testing at both the circuit level and at the board level.

It would also be desirable to use a LFSR as a parallel signature analyzer. Parallel signature analyzers are convenient and inexpensive to use because multiple input bits are analyzed concurrently.

It would also be desirable to use a LFSR in an integrated chip test architecture in which a common bus is used to load data into the registers of the integrated circuit and to carry test data. In this way, the expenditure of integrated circuit chip area is minimized.

SUMMARY OF THE INVENTION

The present invention is generally directed to solving the foregoing and other problems, as well as satisfying the recited shortcomings of known computer graphics systems.

The present invention employs a Linear Feedback Shift Register (LFSR) for testing an integrated circuit chip at the chip level and in a board environment. It uses the same bus that is used for loading data into the chip's various state tables as the bus for chip testing to reduce the chip area that is expended in carrying out the test architecture. A dedicated test out pin is used to shift out a determined test signature or the determined test signature may be compared with an expected signature, in which case the test out pin signals either a pass or a fail condition for the test. In this way, a number of test points or nodes can be simultaneously tested. If desired, selected bits of the test signature can be masked thereby testing only selected nodes for fault isolation and debugging.

BRIEF DESCRIPTION OF THE DRAWINGS

The above-noted and other aspects of the present invention will become more apparent from a description of a preferred embodiment when read in conjunction with the accompanying drawings.

The drawings illustrate a preferred embodiment of the invention, wherein like members bear like reference numerals and wherein:

FIG. 3 is a block diagram of a pixel map logic unit which employs the present invention.

DESCRIPTION OF A PREFERRED EMBODIMENT

Figure 1:
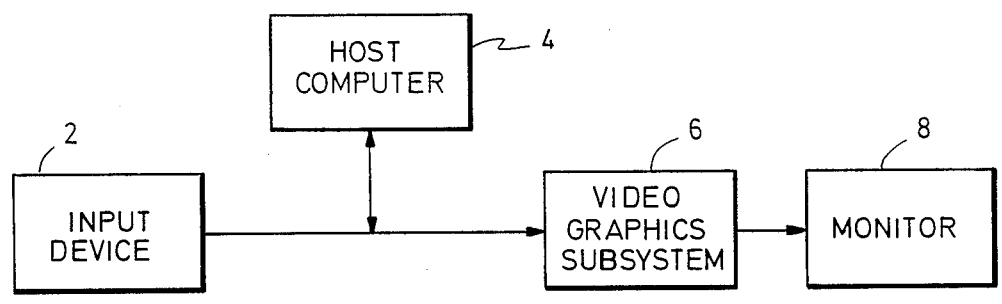
FIG. 1 is a general block diagram of a computer video graphics system employing the invention.

Referring to FIG. 1, a general block diagram of a video graphics system which employs the present invention is shown. An input device 2 functions as the means by which a user communicates with the system, such as a keyboard, a mouse or other input device. A general purpose host computer 4 is coupled to the input device 2 and serves as the main data processing unit of the system. In a preferred embodiment, the host computer 4 employs VAX architecture, as presently sold by the assignee of the present invention. A video graphics subsystem 6 receives data and graphics commands from the host computer 4 and processes that data into a form displayable by a monitor 8. The video graphics subsystem 6 features the use of large volume state tables for storing state data. According to the invention, the video graphics subsystem 6 is specially adapted to provide for testing of the various components within the subsystem 6. In a preferred embodiment, the monitor 8 is an RGB CRT monitor.

Figure 2:
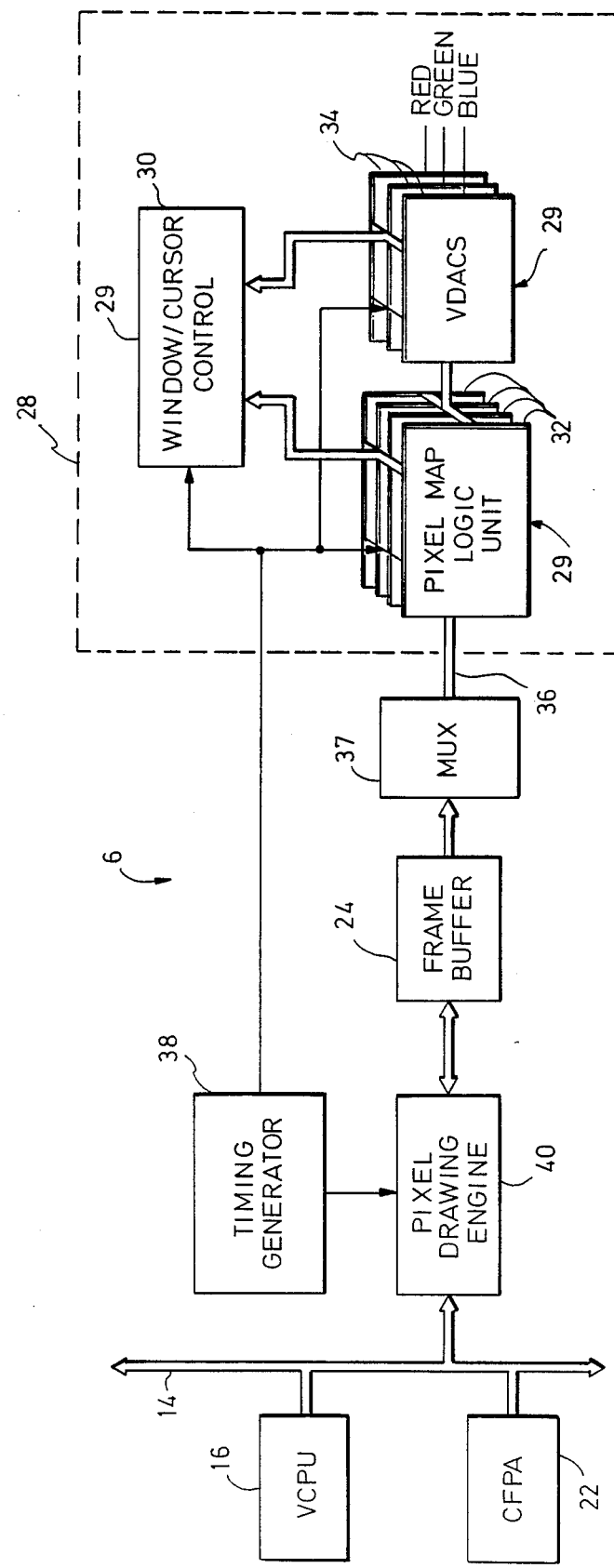
FIG. 2 is a block diagram of a video graphics subsystem employing the present invention.

Referring now to FIG. 2, an embodiment of a video graphics subsystem 6 which employs the present invention is shown. This graphics subsystem is an interactive video generator which may be used for two-dimensional (2D) and three-dimensional (3D) graphics applications.

The graphics subsystem 6 receives graphics commands and data from the host Central Processing Unit (CPU) in the host computer 4 by way of a video graphics subsystem bus (VI-Bus) 14. Graphics subsystem CPU (VCPU) 16 is provided as the main processing unit of the video graphics subsystem 6. The VCPU 16 also employs a floating point unit (CFPA) 22. The VCPU 16/CFPA 22 form the main controller of the graphics subsystem 6. This combination loads all graphics data to the graphics subsystem, provides memory management and an instruction memory.

As used herein, the term graphics rendering is understood to mean the process of interpreting graphics commands and data received from the host CPU 4 and generating resultant pixel data. The resultant pixel data is stored in so-called on-screen or off-screen memory in a frame buffer 24. The graphics rendering section of the graphics subsystem is implemented in a pixel drawing engine 40. This logic element translates addresses received from the host CPU 4 into pixel data addresses and manipulates pixel data.

As used herein, the term graphics display is understood to refer to the process of outputting the pixel data from the frame buffer 24 to a viewing surface, preferably the monitor 8. A video graphics datapath logic section 28 of the graphics subsystem of FIG. 2 is provided. The logic section 28 comprises a window/cursor control 30, a set of pixel map logic units 32 and a set of combined colormap and digital to analog converters (VDACs) 34. Collectively, the window/cursor control 30, the pixel map logic units 32 and the VDACs 34 may be referred to hereinafter as the video graphics or data path logic units 29. In a preferred embodiment, one window/cursor control 30, four pixel map logic units 32 and three VDACs 34 are provided and each of these data path logic units is implemented on a single integrated circuit chip. The video graphics data path logic section 28 defines the windows on the screen and determines the source within the frame buffer 24 which will provide the pixel data for the current window. The video graphics data path logic section 28 also converts the digital information in the video graphics subsystem to an analog form to be displayed on the monitor 8.

In a preferred embodiment, each of the data path logic units 29 is a complex integrated circuit chip containing large amounts of embedded memory and numerous nodes for testing.

FIG. 2 depicts a preferred embodiment for loading data into data path logic unit registers (state tables) in the video data path logic section 28. These data are stored in so-called off-screen scanlines of the frame buffer 24 and are loaded automatically into the window/cursor controls 30, the pixel map logic units 32 and the VDACs 34 by the screen refresh process starting after the last displayable scan. Data for the data path logic units 29 are sequentially loaded through four-bit inputs 36 starting with the least significant bit ("LSB") of the first data path logic unit register ("register <0>") in the data path proceeding through the most significant bit ("MSB") of the last register of the last data path logic unit 29. A single four bit input 36 is used to load data into the state tables of each logic unit. Each input 36 is four bits wide so that data can be transferred and processed at one quarter of the full pixel rate. There are also as many inputs 36, each four bits wide, as there are bits in a pixel; for example, if 24 bits define a pixel, there will be 24 such inputs 36. There may also be additional inputs 36 to accommodate cursor data and overlay plane data. A multiplexer 37 takes the data in the frame buffer 24 and feeds this data to the data path logic units 29 serially. Logic (not shown) generates the sequential addresses for the various registers in the data path logic units 29 in a manner known in the art.

A timing generator 38 is provided to control the loading and output of display data in on-screen memory of the frame buffer 24, the loading of data in off-screen memory for the video output logic section 28 and the generation of timing signals for the monitor 8. Off-screen memory of the frame buffer 24 includes a copy of the data in the state tables of the data path logic units 29. The timing signals for the monitor 8 include conventional horizontal and vertical synchronization (sync) and blank signals.

Referring now to FIG. 3, a preferred embodiment of the pixel map logic unit 32 employing the present invention is illustrated. Bit sizes of the various buses, shown in the conventional manner, are exemplary only, and are not by way of limitation. It is to be understood that FIG. 3 illustrates the primary flow paths of data and is not intended to illustrate all control lines. For example, for proper operation, the various circuit components are presumed to be provided with a proper clock signal in a conventional manner.

Pixel data from the on-screen memory of frame buffer 24 via multiplexer 37 are input to the pixel map logic unit via a set of data input lines 102 into a test/load bus 200. The data input lines 102 carry sufficient bits to define a pixel, in a preferred embodiment 24 bits. Additional data input lines 102 may be provided to accommodate overlay planes. The number of bits in the data input lines 102 equals the number of planes in the frame buffer 24. In a preferred embodiment, a 24 plane frame buffer provides 24 bits per pixel.

The pixel map logic unit 32 is provided with a window number input 104. The window number input 104 carries sufficient bits to select one of a plurality of windows, such as for example, 64 windows. The window number input 104 provides a window number from the window/cursor control 30. A LOAD input 108 and an INHIBIT input 110 are provided to control the loading of data into the various registers in the pixel map logic unit 32. A load data input 106 provides the data from the off-screen memory of the frame buffer 24 via multiplexer 37 to be loaded into the various registers under the control of the LOAD input 108 and the INHIBIT input 110 via a load counter 111.

On each clock pulse, a pixel value at the pixel data input lines 102 and a window number at the window number input 104 are input into the pixel map logic unit 32. The window number input 104 determines how the pixel values at the pixel input lines 102 are arranged to form a set of three 11 bit index values 164. The mapping information is stored in a mapping memory 112, one of the pixel map logic unit's state tables, which is addressed by the window number input 104.

As understood from FIG. 3, the load data input 106 loads the mapping memory 112. In a preferred embodiment, the mapping memory 112 contains register space for 64 mapping configuration words, one mapping configuration word for each window number. Each selected mapping configuration word provides information by which pixel values in one window are manipulated differently than the pixels in another window having a different mapping configuration word.

In loading the mapping memory 112, the load data input 106 provides a base value to the mapping memory 112. The pixel map logic unit 32 processes pixel data from the frame buffer 24 according a specified pixel datatype for each window. The processed pixel value produced in the pixel map logic unit 32 is then converted into an index into a physical colormap in the VDACs 34. These index values are indicated in FIG. 3 as a set of index values 164. This conversion is accomplished by adding a base value from the mapping memory 112 via a base address MUX 114 to the pixel value in a set of adders 109. The pixel value is provided to the adders 109 by a mask unit 115. The base value is selected based on the window containing this pixel. The pixel value is therefore a relative index into a window's virtual colormap, which is pointed to by the base value.

During the loading of information into the pixel map logic unit, a load counter 111 keeps track of the loading and directs the loading of data to the next appropriate state table. The same logic is used for the loading of test data onto the test/load bus 200 and for the dumping of data from the state tables. The same is true for all of the data path logic units. The test/load bus provides the data for test to a signature analyzer 198 which provides test results on a dedicated test output pin 204.

Figure 4:
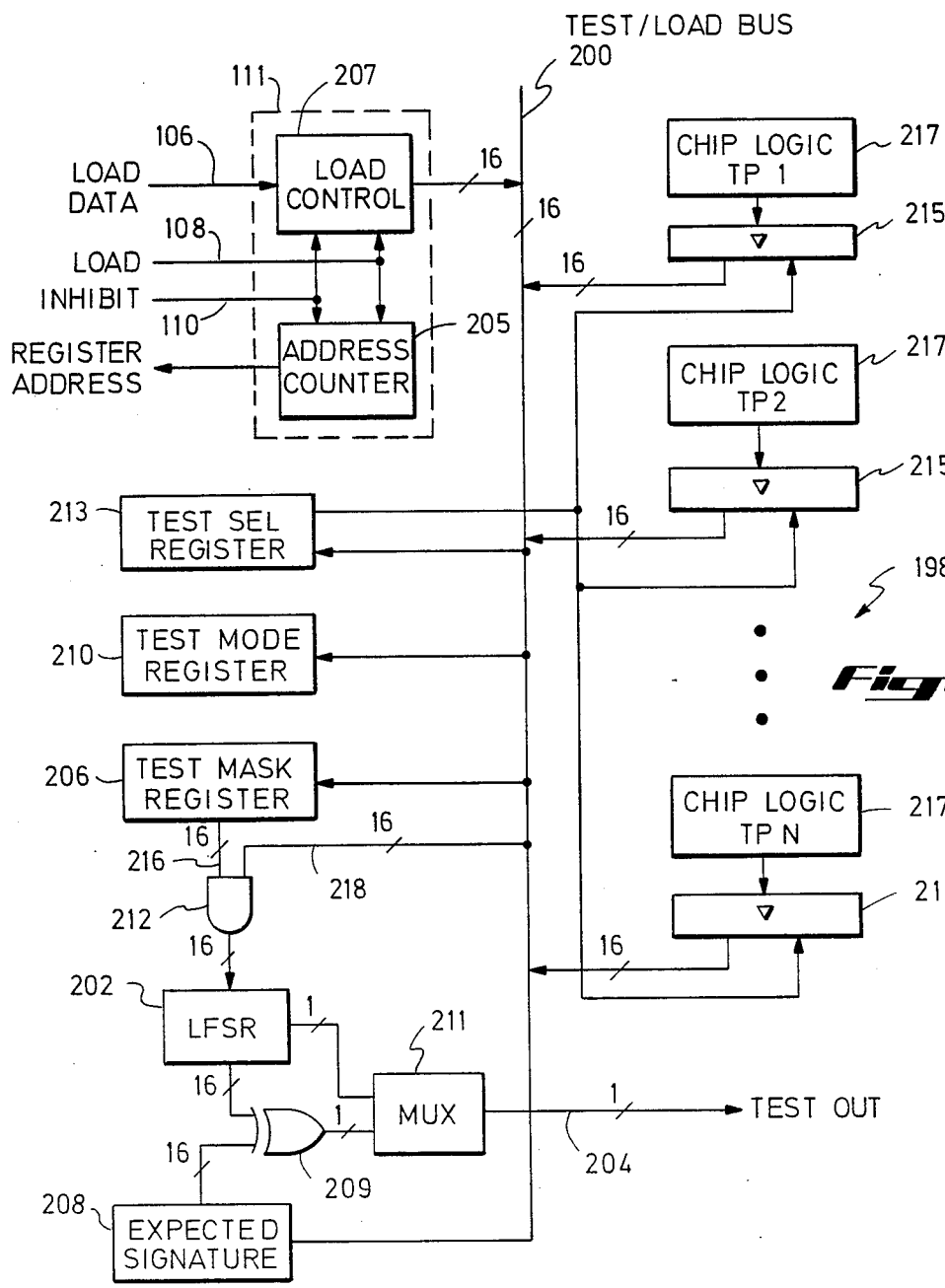
FIG. 4 is a block diagram of an embodiment of the test architecture which carries out the present invention.

FIG. 4 depicts an embodiment of the present invention in which the test/load bus 200 is used to sequentially load test data and other data into the chip and is also used to sample test points and read previously loaded data from the data path logic unit's state tables. The test/load bus 200 and its control logic are used for both testing the chip and for loading data onto the chip so that the test capability adds very little to the area of the chip.

The signature analyzer 198 includes a 16 bit linear feedback shift register (LFSR) 202. During testing, values on the test/load bus 200 are latched into the LFSR 202. For reading back the contents of the chip registers and RAM, it acts as a serial shift register by shifting out its contents onto a single dedicated test output pin 204. For testing the operation of the chip, it acts as a linear feedback shift register (LFSR), which shifts its current value and uses a set of exclusive-OR gates, depicted in FIG. 5, to combine it with the value at a set of test points on each clock pulse. Nodes from all over the chip can be used as test points, since the test/load bus 200 must be routed to registers all over the chip. Individual bits on the test/load bus 200 can be masked out by a test mask register 206, allowing tests to look at only the desired set of nodes for fault isolation. Signature analysis can also be performed on the contents of the chip registers.

The LFSR can be used as a signature analyzer to compute signatures. At the end of the test sequence, the computed signature in the LFSR 202 can either be shifted out on the test output pin 204, or can be compared to a previously specified test result which has been loaded into expected signature register 208, with only pass/fail indication being output. In this case, the contents of the LFSR 202 are compared with the contents of the expected signature register 208 in an exclusive-OR gate 209. Any bit mismatch results in a high output to a multiplexer 211 which provides an indication of a failed test result onto the test output pin 204.

The loading and reading are controlled by the two load control pins, the LOAD input 108 and the INHIBIT input 110, as well as a dump enable bit of a test mode register 210. A load control 207 and an address counter 205 comprise the load counter 111 to properly direct the loading of the various registers. The test mode register 210 is loaded from the test/load bus 200 with a word that determines the mode of operation of the signature analyzer 198: pass/fail mode which results in a "GO/NO-GO" indication at the test-output pin 204, a signature mode in which a tested signature is sequenced out of the test output pin 204, a dump mode in which the contents of the various registers of integrated circuit chip are read out in the same order as they were loaded, a mode in which dump data is signature analyzed, or performs no test function. All test modes except for memory dumps occur during normal integrated circuit function.

Self test is performed on one, several or all of the 16 internal bit streams of the test/load bus 200 as selected by the test mask register 206. This register is used to mask individual inputs to the signature analyzer. The register contains 16 bits, each of which masks one bit entry into the LFSR 202. These bits are ANDed by an AND gate 212 with the data bit streams at the input to the LFSR 202. In this way, a "O" loaded into a particular bit in the test mask register 206 results in a "O" for that bit out of the AND gate 212, masking that bit.

The expected signature register 208 contains 16 bits and is used to load previously specified test results which are compared with the contents of the LFSR 202. The data from this register does not affect the computed signature while performing signature analysis of internal registers.

A test select register 213 selects which of a set of drivers 215 drive the test/load bus 200 in the test mode. A set of chip logic test points (TP1 through TPN) 217 are provided as test points or nodes.

The main timing control for the signature analyzer is the Load input 108. When the Load input 108 is in a high state (vertical retrace time), the result of the previous test is reported. Testing starts on the first scan of a frame if enabled by the test mode register 210. At the beginning of the test, all of the bits of the LFSR 202 are initialized to logic "1". At the end of the frame, the test result is reported. The beginning of a frame is sensed when the Load input 108 changes state from "1" to "0". The end of a frame is sensed when the Load input 108 changes state from "0" to "1".

The test output pin 204 may be used in one of two modes to report the results of signature analysis. These modes are selected by the test mode register. The two modes are pass/fail report and shifting out the computed signature or Cyclic Redundancy Check (CRC). In the pass/fail mode, the test output pin 204 is forced to a low state for one clock after the Load input 108 goes to a high state (end of signature analysis test), and then reports the result of the test as a high state for pass and a low state for fail, depending on whether the computed CRC is equal to the contents of expected signature register. Forcing the test output pin 204 low for one clock has two advantages. First it detects stuck-at faults on the test output pin 204 by causing all passed tests to result in a positive going edge. Second, it allows a simple counter to be used to count the number of passed tests in an extended qualification test. After the test result is reported, and if the next frame computes a signature with a pass/fail report mode, the test output pin holds its output value during the active frame time, while the next test is being performed.

In the signature mode, the actual computed signature is shifted out rather than a pass/fail report. The primary purpose of this mode is to obtain the expected signatures experimentally rather than by an algorithm. In this mode, the test output pin 204 is forced to a high state as soon as the Load input 108 goes low, and remains high during the signature analysis. After the Load input 108 goes high again at the end of the active time frame, the test output pin 204 is forced to a low state for one clock as a start bit, and then the computed signature is shifted out, LSB first. After the MSB of the CRC is shifted out, the test output pin 204 is forced high. The Inhibit input 110 cannot be used to stop shifting of the CRC since the Inhibit input 110 must be used to inhibit the loading of data at the same time. Any system that allows the signature to be captured, must provide storage for all 16 bits of shifted data.

The test output pin 204 can be used to read the registers in the chip. When this mode is selected, the test output pin 204 is forced to a high state as soon as the Load input goes low. After the Load input 108 goes low, the test output pin 204 is forced to a low state for a single clock, as a start bit, and then the internal register data is shifted out. Registers are shifted out from LSB to MSB, in the same order that they were loaded. After the MSB of the last register is shifted out, the test output pin 204 is forced high. The Inhibit input 110 can be used to halt data shifting; however, the register dump is terminated when the Load input 108 goes high again at the end of the active frame time, even if the entire chip data was not allowed to dump. If the Inhibit input is asserted very early in the shifting process (i.e., before the start bit), then the assertion of the test output bit is delayed until after the Inhibit input 110 is de-asserted. Also, if the Inhibit input 110 is asserted after the start bit, then the inhibit function occurs as previously indicated. The Inhibit and Test Out start bit are considered to be coincident when the chip clocks in the Inhibit signal on the same clock that shifts out the start bit. When this occurs, it is impossible for the chip to delay assertion of the start bit because the start bit is already committed. Also, the chip cannot inhibit the shifting of data since the data has not yet begun to shift out. Instead the chip will inhibit (stretch) the start bit. Whenever this mode is selected, the chip outputs, other than Test Out, are undefined until the chip is reloaded with valid data and resumes normal operation.

The final signature analysis test mode provided in the chip allows register data in the chip to be signature analyzed. This mode is selected by the test mode register 210, which enables both dumping and signature analysis. During this test, the chip outputs are undefined, as they are when dumping data out of the chip. The test mode register selects whether the test output pin 204 reports a pass/fail result or whether it shifts out the computed CRC, as explained above. The timing for the test report is identical to normal signature analysis.

Figure 5:
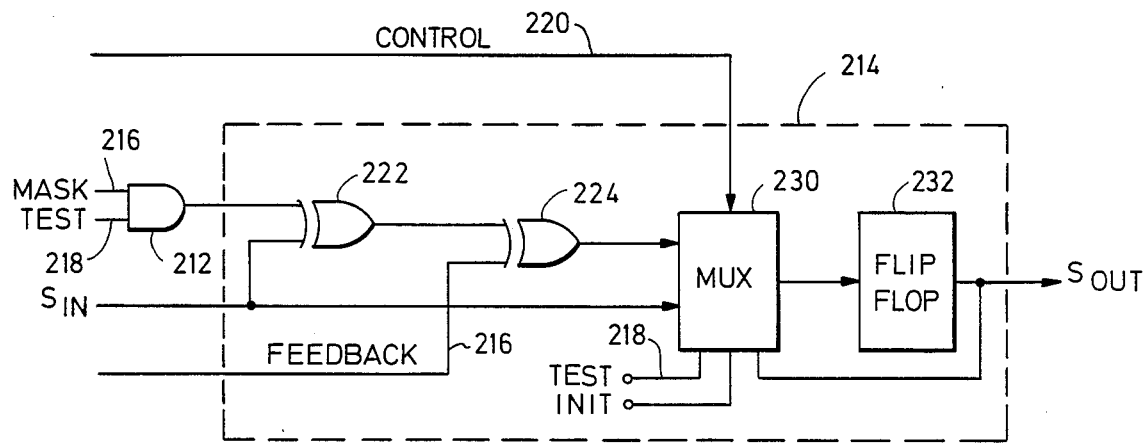
FIG. 5 is a logic diagram of a cell in a linear feedback shift register used in an embodiment of the present invention.
Figure 6:
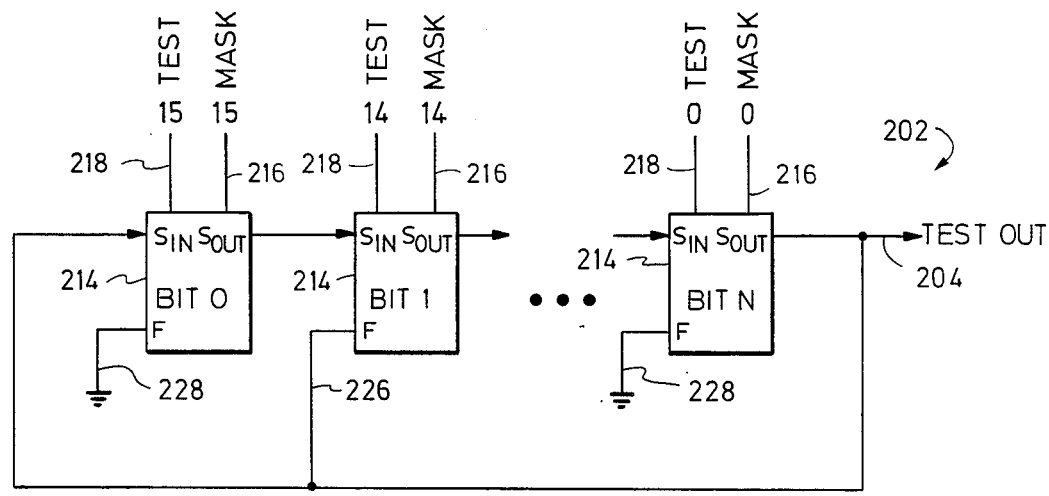
FIG. 6 is a block diagram of a linear feedback shift register.

FIGS. 5 and 6 depict a linear feedback shift register employed in a preferred embodiment of the present invention. FIG. 5 depicts one segment or cell 214 of the shift register 202 of FIG. 6. A set of mask inputs 216 are provided by the test mask register 206 and a set of test inputs 218 are provided from the test/load bus 200. A control line 220 is provided by the test mode register and control logic 210 to direct the mode of operation of the shift register 202. A pair of exclusive-OR gates 222 and 224, in combination with a set of selected feedback lines 226, determined the characteristic polynomial of the shift register 202. A connected feedback 226 represents a "1" while a grounded feedback input 228 represents a "0" in the polynomial. A multiplexer 230 and a flip-flip 232 compute and shift out the signature bit from a previous cell into a subsequent cell, through to the test output pin 204 for the most significant bit (BIT N).

A feature of the present invention is that is provides common logic to perform signature analysis compression of the contents of the various registers and of the signal values of the various nodes. That is, values from the large state tables and the various nodes are selectively tested resulting in a test signature or a simple pass/fail result.

The principles, preferred embodiments and modes of operation of the present invention have been described in the foregoing specification. The invention is not to be construed as limited to the particular forms disclosed, since these are regarded as illustrative rather than restrictive. Moreover, variations and changes may be made by those skilled in the art without departing from the spirit of the invention.

What is claimed is:

1. In a clocked integrated circuit implemented on a semiconductor chip, and having a control register, a multiple input linear feedback shift register, a plurality of test points located at predetermined nodes in said circuit, a plurality of memory registers, and further having a common load/test circuit implemented on the semiconductor chip, a method of testing the integrated circuit using the common load/test circuit to provide a resultant test signature indicative of the values at said nodes, comprising the steps of:
   a. specifying in the control register the set of test points to be tested;
   b. loading test data into at least one of the memory registers by way of the common load/test circuit;
   c. commencing testing of the test points during a test period, the test period having defined subperiods in which the test is not performed, the test period defined by several of the integrated circuit clock cycles;
   d. sampling the set of test points during each clock cycle to provide a set of test data;
   e. entering said test data into the multiple input linear feedback shift register; and
   f. at the conclusion of the test period, shifting the resulting test data out of the shift register thereby to provide said signature;
wherein the semiconductor chip comprises a data path logic unit in a video graphics system and wherein the testing of step is performed during video monitor refresh and wherein the step of shifting the resulting test data of step is performed during video monitor vertical retrace.

2. The method of claim 1 further comprising the step of masking selected test points which a test is not desired.

3. The method of claim 1 wherein the integrated circuit has input terminals connected to the common load/test circuit, and wherein the step of testing includes the step of applying data to said input terminals and the step of reading signal values at said nodes.

4. In a clocked integrated circuit implemented on a semiconductor chip and having a control register, a multiple input linear feedback shift register, a plurality of test points located at predetermined nodes in said circuit, a plurality of memory registers, and further having a common load/test circuit implemented on the semiconductor chip, a method of testing the integrated circuit using the common load/test circuit to provide a resultant test signature indicative of the values at said nodes, comprising the steps of:
   a. specifying in the control register the set of test points to be tested;
   b. loading at least one of the memory registers with test data by way of the common load/test circuit;
   c. commencing testing of the test points during a test period, the test period having defined subperiods in which the test is not performed, the test period defined by several of the integrated circuit clock cycles;
   d. sampling the set of test points during each clock cycle to provide a set of test data;
   e. entering said test data into the multiple input linear feedback shift register; and
   f. at the conclusions of the test period, comparing the resulting signature to a prestored, dynamically-variable expected signature value providing a pass/fail result.

5. The method of claim 4 further comprising the step of masking selected test points for which a test is not desired.

6. The method of claim 4 wherein the integrated circuit has input terminals connected to the common load/test circuit, and wherein the step of testing includes the step of applying data to said input terminals and the step of reading signal values at said nodes.

7. In an integrated circuit implemented on a semiconductor chip, test architecture also implemented on said semiconductor chip for testing said integrated circuit to provide a pass/fail result for a specified set of test points, comprising:
   a. a clocked integrated circuit having registers, at least one of the registers comprising a control register, the control register providing means for specifying the set of test points to be tested;
   b. a common load/test bus on the integrated circuit for loading data into the registers and for reading data from the registers, said common load/test bus being operable during normal operation of the integrated circuit;
   c. test points on the integrated circuit for providing signal values thereat during testing;
   d. means, coupled tot he common load/test bus, for commencing testing of the test points during a test period, the test period having defined subperiods in which the test is not performed, the test period defined by several of the integrated circuit clock cycles;
   e. a linear feedback shift register, the linear feedback shift register having an output, the linear feedback shift register being coupled to the common load/test bus for computing a signature corresponding to the values of the test points; and
   e. an expected signature register, coupled to the common load/test bus, for storing a dynamically-variable expected signature value to be compared with the computed signature from the linear feedback shift register to provide a pass/fail result at the output.

8. The test architecture of claim 7 further comprising a test mask register for masking test points from testing.

9. The test architecture of claim 7 wherein said bus serves as a load bus and a test bus and wherein common logic is used for loading and testing the integrated circuit.

10. The test architecture of claim 7 wherein common logic is used for testing the integrated circuit and for dumping the contents of the registers.

11. The test architecture of claim 7 wherein common logic performs signature analysis compression of the contents of the registers and of the signal values at the test points.

12. In an integrated circuit implemented on a semiconductor chip comprising a data path logic unit in a video graphics system, test architecture also implemented on said semiconductor chip for testing said integrated circuit to provide a test signature therefor for a specified set of test points, comprising:
 a. a clocked integrated circuit having registers, at least one of the registers comprising a control register, the control register providing means for specifying the set of test points to be tested;
 b. a common load/test bus on the integrated circuit for loading data into the registers and for reading data from the registers during video monitor refresh, said common load/test bus being operable during normal operation of the integrated circuit;
 c. test points on the integrated circuit for providing signal values thereat during testing;
 d. means, coupled to the common load/test bus, for commencing testing of the test points during a test period, the test period having defined subperiods in which the test is not performed, the test period defined by several of the integrated circuit clock cycles;
 e. a linear feedback shift register, the linear feedback shift register having an output, coupled to the common load/test bus for computing a signature corresponding to the values of the test points and providing this signature at the output.

* * * * *

UNITED STATES PATENT AND TRADEMARK OFFICE
CERTIFICATE OF CORRECTION

PATENT NO. : 4,929,889
DATED : May 29, 1990
INVENTOR(S) : Seiler et al.

It is certified that error appears in the above-identified patent and that said Letters Patent is hereby corrected as shown below:

On the title page under Assistant Examiner please insert --Attorney, Agent or Firm-Arnold, White & Durkee--.

In column 9, line 47; please replace "testing of step is" with --testing of step b. is--.

In column 9, line 49; please replace "data of step is" with --data of step f. is--.

In column 10, line 44; please replace "coupled tot he common" with --coupled to the common--.

Signed and Sealed this

Fourth Day of September, 1990

*Attest:*

HARRY F. MANBECK, JR.

*Attesting Officer*     *Commissioner of Patents and Trademarks*